United States Patent

Miyazawa et al.

[11] Patent Number: 5,770,993
[45] Date of Patent: Jun. 23, 1998

[54] THERMAL FUSE

[75] Inventors: Kazuhiro Miyazawa, Anjo; Shinji Iwama, Nagoya; Masaki Sanji, Kariya; Yasufumi Kojima, Gifu, all of Japan

[73] Assignee: Nippondenso Co., Ltd, Japan

[21] Appl. No.: 719,208

[22] Filed: Sep. 25, 1996

[30] Foreign Application Priority Data

Sep. 26, 1995 [JP] Japan ................................. 7-247935

[51] Int. Cl.$^6$ .................................................. H01H 85/04
[52] U.S. Cl. .......................... 337/160; 337/142; 337/297; 338/50; 338/215; 338/309
[58] Field of Search .................... 358/307, 308, 358/309, 50, 53, 57, 58, 67, 215; 337/160, 123, 139, 140, 141, 297, 142

[56] References Cited

U.S. PATENT DOCUMENTS

| 3,076,881 | 2/1963 | Bastian | 337/160 |
| 3,775,724 | 11/1973 | Mamrick et al. | 337/297 |
| 4,547,830 | 10/1985 | Yamauchi | 337/160 |
| 4,626,818 | 12/1986 | Hilgers | 327/297 |
| 4,862,134 | 8/1989 | Poerschke et al. | 327/297 |
| 5,192,937 | 3/1993 | Lee . | |
| 5,408,575 | 4/1995 | Morris | 388/830 |
| 5,550,527 | 8/1996 | Lee | 338/50 |
| 5,563,570 | 10/1996 | Lee | 338/50 |

FOREIGN PATENT DOCUMENTS

| 3-280318 | 12/1991 | Japan . |
| 2 296 847 | 7/1996 | United Kingdom . |

OTHER PUBLICATIONS

English translation to Ezaki (JP3–280318).

*Primary Examiner*—Teresa J. Walberg
*Assistant Examiner*—Karl Easthom
*Attorney, Agent, or Firm*—Cushman Darby & Cushman Intellectual Property Group of Pillsbury Madison & Sutro, LLP

[57] ABSTRACT

A resistor with a thermal fuse includes: a substrate consisting of an insulating material; a wire pattern formed on a surface of the substrate; a gap for electrically cutting off the wire pattern; a plate spring consisting of an electrically conductive material arranged across the gap; an electrically conductive member fixed to one end of the plate spring on a side of the wire pattern and having approximately the same linear conduction coefficient as that of the substrate; a first low melting point alloy for welding the electrically conductive material and the wire pattern provided on one side of the gap; a second low melting point alloy for welding the other end of the plate spring and the wire pattern provided on the other side of the gap; wherein, when the first low melting point alloy is melted, the electrically conductive member is released from the first low melting point alloy so that the plate spring is also released from the wire pattern.

6 Claims, 4 Drawing Sheets

THERMAL FUSE

BACKGROUND OF THE INVENTION

1. Field of the Invention

The present invention relates to a resistor with a thermal fuse. The resistor according to the present invention is advantageous for a resistor used as a speed control device provided for a blower in a vehicle.

2. Description of the Related Art

Recently, a resistor with a thermal fuse has been widely used in various fields, such as a home electronics equipment, an alarm system in a vehicle and buildings, and the like. As is known, the thermal fuse operates when peripheral temperature abnormally rises and a low melting point alloy, which holds the thermal fuse, melts. In this case, before the low melting point alloy is melted, i.e., before the thermal fuse operates normally, a crack may occur in the low melting point alloy caused by different thermal expansion between structural elements, such as a thermal fuse, a wire pattern and a substrate. This crack results in disconnection between the thermal fuse and the wire pattern.

Accordingly, it is desired to provide an improved resistor with a thermal fuse which can solve the problem of the different thermal expansion between the structural elements.

SUMMARY OF THE INVENTION

The object of the present invention is to provide an improved resistor with a temperature fuse which can suppress occurrence of a crack in the low melting point alloy caused by different thermal expansions between structural elements.

In accordance with the present invention, there is provided a thermal fuse including: a substrate consisting of an insulating material; a wire pattern formed on a surface of the substrate; a gap for electrically cutting off the wire pattern; a plate spring consisting of an electrically conductive material and arranged across the gap; an electrically conductive member fixed to one end of the plate spring on a side of the wire pattern and having approximately the same linear expansion coefficient as that of the substrate; a first low melting point alloy for welding the electrically conductive material and the wire pattern provided on one side of the gap; a second low melting point alloy for welding the other end of the plate spring and the wire pattern provided on the other side of the gap; wherein, when the first low melting point alloy is melted, the electrically conductive member is released from the first low melting point alloy so that the plate spring is also released from the wire pattern.

In a preferred embodiment, the plate spring has a shape for absorbing thermal expansion thereof at a position between the first and second low melting point alloys.

In another preferred embodiment, the electrically conductive member has a hairpin-like shape, and is caulked to one longitudinal end of the plate spring.

In still another preferred embodiment, the electrically conductive member has a hairpin-like shape so as to have an elastic force, and is fixed to one longitudinal end of the plate spring based on its elastic force.

In still another preferred embodiment, the electrically conductive member has a rivet-like shape, is inserted into a hole provided on the end of the plate spring, and is pressed and fixed to one end of the plate spring so as to form a flat portion on the side of the wire pattern.

In still another preferred embodiment, the electrically conductive member is fixed to the plate spring and is able to thermally expand independently of the plate spring.

DESCRIPTION OF THE PREFERRED EMBODIMENTS

Before describing the preferred embodiments, a conventional art and its problem will be explained in detail below.

Figure 1A:
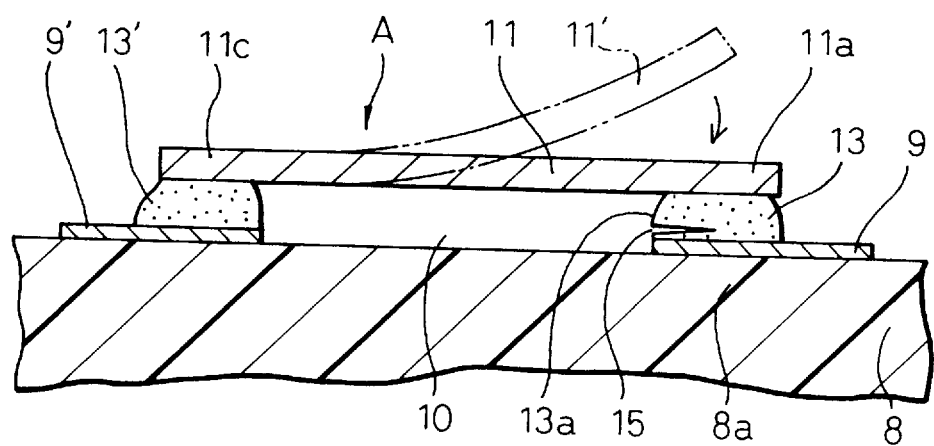
FIGS. 1A and 1B are sectional views of a resistor with a thermal fuse according to a conventional art.
Figure 1B:
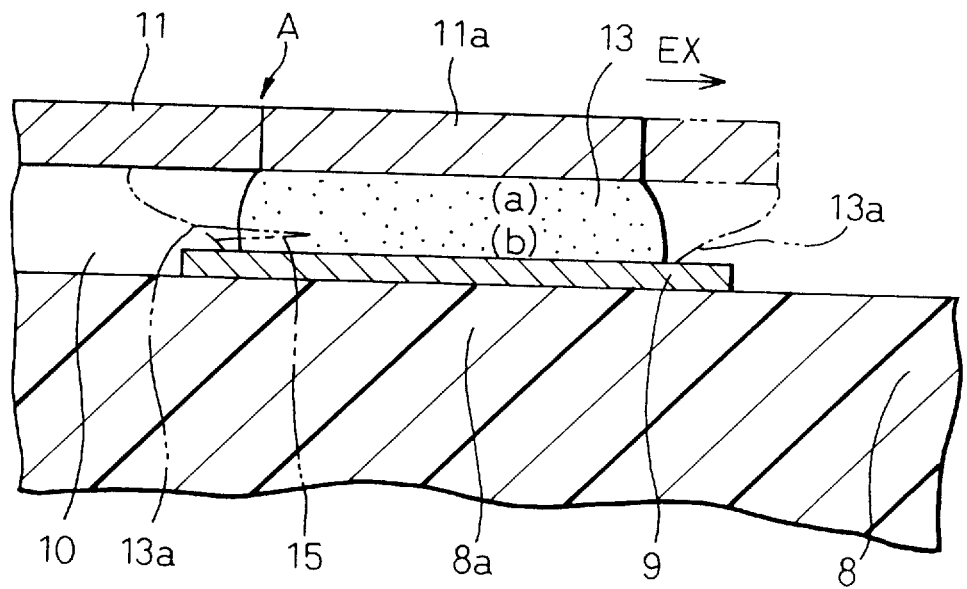

FIGS. 1A and 1B are sectional views of a resistor with a thermal fuse according to a conventional art. This conventional art has been disclosed in Japanese Unexamined Patent Publication No. 3-280318.

In FIGS. 1A and 1B, reference letter A denotes a thermal fuse, 8 a substrate, 9 (9') a wire pattern, 10 a gap, 11 a plate spring, 11a and 11c end portions of the plate spring, and 13 (13') a low melting point alloy.

In FIG. 1A, the plate spring 11, made of a metal, is previously bent as shown by a chain dotted line (see the reference number 11'). Then, the plate spring 11 is formed straight by using the low melting point alloy 13 (13') as shown by a solid line, and arranged across the gap 10 which is formed by cutting a part of wire pattern 9 (9') provided on the substrate 8. Both of ends 11a and 11c of the plate spring 11 are electrically connected to the wire pattern 9 (9') by welding the low melting point alloy 13 and 13'.

Further, the wire pattern 9 (9') includes a resistance element (not shown) therein. When an over-current flows through the resistor, the resistance element becomes hot due to Joule heating. As a result, the low melting point alloy 13 is heated and melted so that the end portion 11a of the plate spring 11 is released from the low melting point alloy 13 and returned to the original position shown by the chain doted line 11' in accordance with an elastic force of the spring itself. Accordingly, the connection between the wire patterns 9 and 9' is broken (i.e., a circuit is turned off). In general, in order to perform this operation, the end portion 11a of the plate spring 11 is arranged in the vicinity of the position where the temperature becomes the highest on the substrate 8.

However, in the above explained conventional resistor, when the resistor has been used for a long time, a crack(s) 15 may occur in the low melting point alloy 13 as shown by the drawing. When this crack 15 grows large, the low melting point alloy 13 is gradually destroyed and completely cut off from the wire pattern after a short time. Accordingly, there are problems that the thermal fuse cannot operate normally and a heating of the resistance element cannot be detected correctly.

The crack in the low melting point alloy will be explained in detail below. In the conventional resistor with the thermal fuse, the resistance element which is provided within the wire pattern 9 becomes hot in a normally activated state even if an over-current does not flow therethrough. In this case, the heating of the resistance element is not high compared to the heating in the abnormal state so that the low melting point alloy 13 is not melted. However, the substrate 8, the wire pattern 9 (9'), the plate spring 11, and the low melting point alloy 13 thermally expand due to this heating (i.e., thermal expansion). At the same time, the low melting point alloy 13 becomes soft.

In this case, since the wire pattern 9 (9') is very thin compared to the substrate 8 and strongly fixed to the substrate 8, the thermal expansion of the wire pattern 9 (9') becomes equivalent to that of the substrate 8. Further, the linear expansion coefficient of the plate spring 11 consisting of the metal spring member, such as a beryllium copper or a phosphor bronze spring, is larger than that of the substrate 8 consisting of an insulating material. Accordingly, although the plate spring 11 expands in the longitudinal direction caused by the heating (i.e., expanded to the right of the plate spring 11), the wire pattern 9 (9') is only slightly expanded in the same direction compared to the plate spring 11.

As a result of the different thermal expansion between the plate spring 11 and the substrate 8, the low melting point alloy 13 receives a stress and is deformed in such a way that the upper side of the low melting point alloy 13 (i.e., a side of the plate spring 11 indicated by (a) in FIG. 1B) is deformed in the longitudinal direction caused by the thermal expansion of the plate spring 11.

However, a lower side of the low melting point alloy 13 (i.e., a side of the substrate 8 indicated by (b) in FIG. 1B) is slightly deformed. As a result, a thermal stress is applied to the end portion 13*a* of the low melting point alloy 13 so that the crack 15 occurs at that portion. Further, since the turning on/off operation is repeated in the electric circuit, the above deformation of the low melting point alloy 13 is repeated so that the crack grows larger.

As a countermeasure to the above problem, the inventor of the present application had proposed a U-shaped portion provided in the vicinity of a center of the plate spring 11 in order to absorb the thermal expansion between the low melting point alloy 13 and 13'. However, this was insufficient to clearly suppress the crack in the low melting point alloy 13.

Further, the inventor found the following fact. That is, as explained above, the end portion 11*a* of the plate spring 11 is arranged in the vicinity of the position where the temperature becomes the highest in the substrate 8. Accordingly, even if the U-shaped portion is provided in the vicinity of the center of the plate spring 11, as shown in FIG. 1B, the plate spring 11 is expands in the longitudinal direction from the vicinity of the center of the low melting point alloy 13.

Accordingly, as shown by the chain dotted line in FIG. 1B, the upper side (a) of the low melting point alloy 13 is deformed in the longitudinal direction (see an arrow EX) from the vicinity of the center. However, the lower portion (b) is only slightly deformed in the same direction from the vicinity of the center. As a result, the thermal stress is applied to the end portion 13*a* of the low melting point alloy 13, and the deformation of the low melting point alloy 13 is repeated in accordance with the turning on/off of the electric circuit so that the crack 15 occurs in the end portion 13*a*. Further, the crack 15 grows larger when the deformation is repeated so that the low melting point alloy 13 is cut off.

The present invention aims to suppress occurrence of the crack in the low melting point alloy 13 as explained in detail below.

Figure 2:
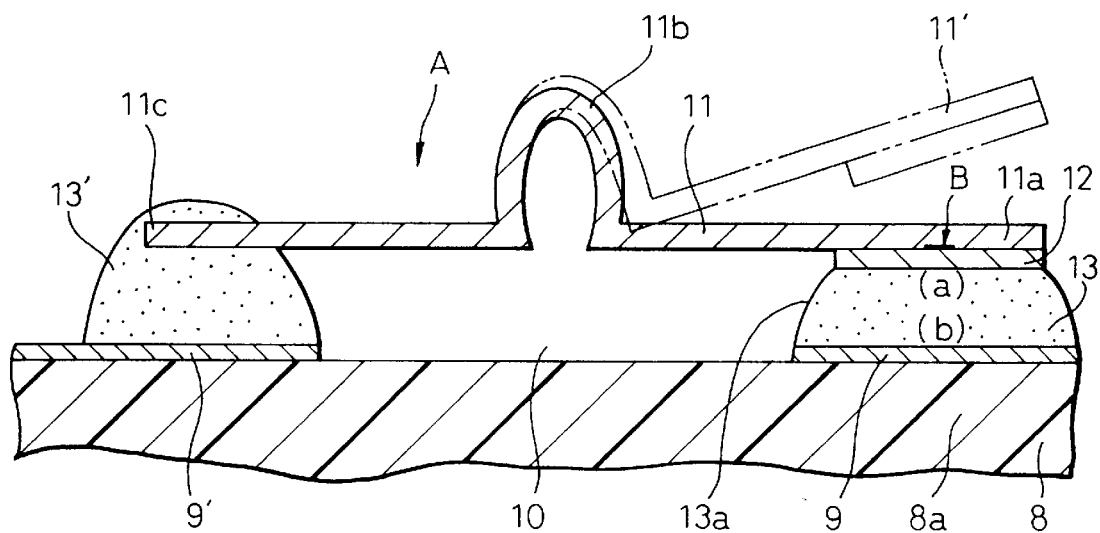
FIG. 2 is a sectional view of a resistor with a thermal fuse according to the present invention.

FIG. 2 is a sectional view of a resistor with a thermal fuse according to the present invention. In FIG. 2, the reference numbers used in FIGS. 1A and 1B are attached to the same elements in this drawing.

According to the present invention, one feature lies in that an electrically conductive member 12, which has approximately the same linear expansion coefficient as that of the substrate 8, is provided to an inner surface (i.e., the side of the low melting point alloy 13) of the end portion 11*a* of the plate spring 11.

As a result, when the wire pattern 9 (9') is heated in the normally activated state, the electrically conductive member 12 is expanded in the longitudinal direction by approximately the same amount as the substrate 8. In this case, the wire pattern 9 (9') is also expanded to the longitudinal direction by approximately the same amount as the substrate 8. Accordingly, the deformation of the plate spring 11 becomes approximately the same as the deformation of the low melting point alloy 13 at the side of the wire pattern 9 (9'). Therefore, the thermal stress, which is applied to the end portion of the low melting point alloy 13, becomes very small so that it is possible to easily prevent the cracking which occurs in the low melting point alloy 13.

Further, as another feature, the plate spring 11 has a shape which absorbs the deformation caused by the thermal expansion, between a first low melting point alloy 13 and a second low melting point alloy 13'. According to this shape, the thermal expansion of the plate spring 11 in the longitudinal direction becomes small so that it is possible to suppress the deformation of the longitudinal direction of the plate spring 11. As a result, the thermal stress, which is applied to the end portion of the low melting point alloy 13, becomes very small so that it is possible to prevent the cracking which occurs in the low melting point alloy 13.

Still further, as still another feature, a mechanically fixing means, for example, a rivet (see FIGS. 6A to 6C) is used for fixing the electrically conductive member 12 to the end portion 11*a* of the plate spring 11, it is possible to easily mount the electrically conductive member 12 to the plate spring 11.

The preferred embodiments of the present invention will be explained in detail below.

Figure 3:
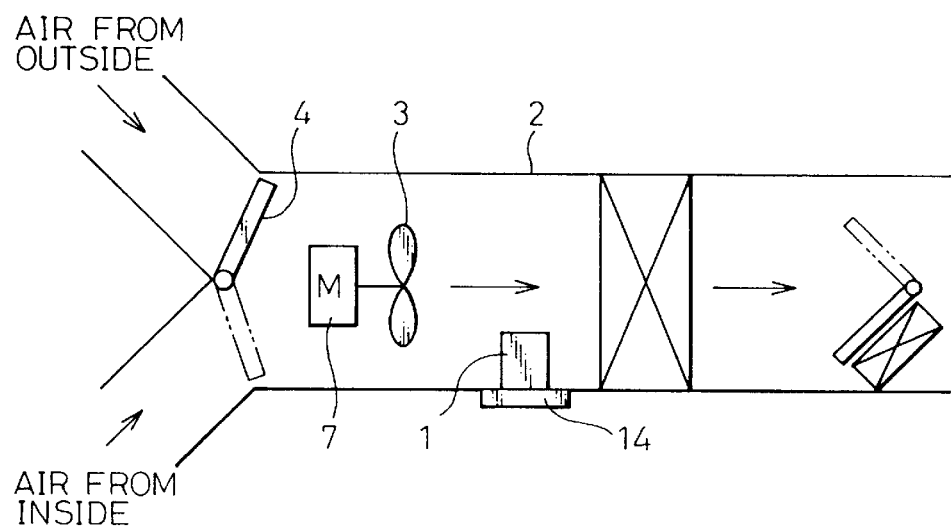
FIG. 3 shows one example of the resistor with the thermal fuse which is applied to a resistor used as a speed control device provided for a blower of a vehicle.

FIG. 3 shows one example of a resistor with the thermal fuse, which is applied to a resistor used as a speed control device (below, speed control resistor) provided for a blower of a vehicle. In this drawing, reference number 1 denotes a speed control resistor, 2 an air duct, 3 a fan, 4 a damper, 7 a blower motor, and 14 a bracket. The speed control resistor 1 is provided downstream of the fan 3 and fixed to an inner surface of the air duct 2 through the bracket 14 which is fixed to an outer surface of the duct 2 by using screws. Accordingly, the speed control resistor is always cooled by the air from the fan 3. In the drawing, the damper 4 is provided for switching the air from the outside and the air from the inside.

Figure 4:
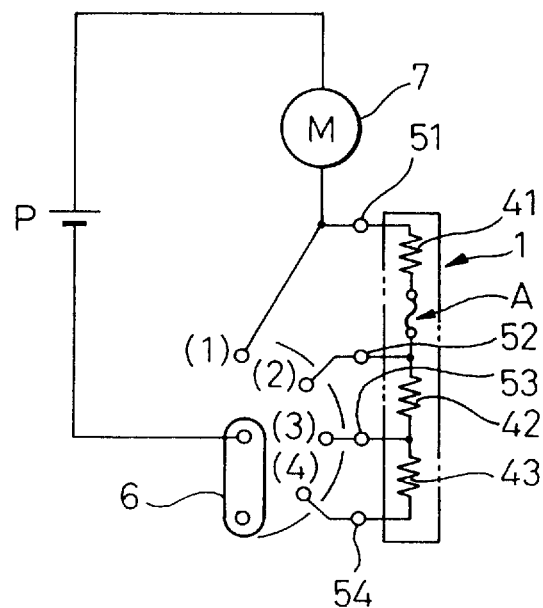
FIG. 4 is an electronic circuit including the speed control resistor.
Figure 5:
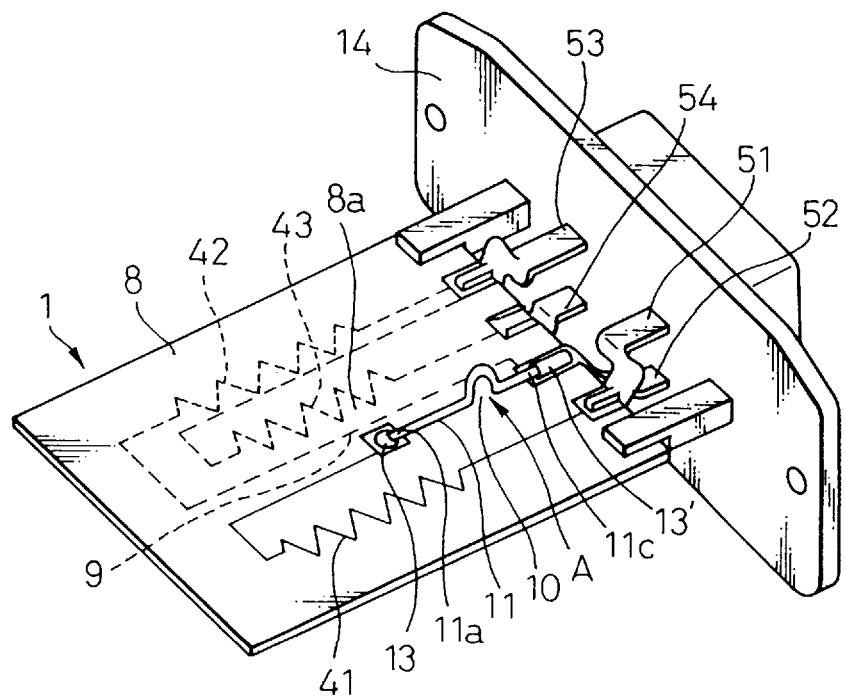
FIG. 5 is a perspective view of a mechanical structure of the electronic circuit of FIG. 4.

FIG. 4 is an electric circuit including the speed control resistor, and FIG. 5 is a perspective view of a mechanical structure of the electric circuit of FIG. 4.

As shown in FIG. 4, the electric circuit includes the speed control resistor 1 consisting of a thermal fuse A, resistance elements 41 to 43, and terminals 51 to 54; a movable member 6 provided to a switch; and the blower motor 7. Further, reference letter P denotes a power source for the blower motor 7.

The movable member 6 is switched to any one of contact points (1) to (4) in order to change the current amount flowing through the blower motor 7. As a result, the rotational speed of the blower motor 7 is changed in accordance with the change in the current so that it is possible to change the amount of air (i.e., an airflow amount) from the fan 3.

In actual use, a driver of the vehicle operates a switch knob (not shown) which is provided in the vehicle, for changing the airflow amount so as to obtain the maximum airflow amount from the fan 3 by connecting the movable member 6 to the contact point (1).

In this case, since the current is directly supplied to the blower motor 7 through the movable member 6 and the contact point (1), and since resistance elements 41 to 43 are not included in a current path to the blower motor 7, the current flowing through the blower motor 7 becomes maximum. On the contrary, when the movable member 6 is connected to the contact point (4), since the current flows through all resistance elements 41 to 43, the current flowing through the blower motor 7 becomes minimum so that it is possible to obtain the minimum airflow amount.

In an actual structure, as shown in FIG. 5, the speed control resistor 1 is mounted on the inner surface of the air duct 2 by using the bracket 14 as shown in FIG. 4. In FIG. 5, resistance elements 41 to 43 are provided on the front and back surfaces of the substrate 8 (see the solid line 41 and the dotted lines 42 and 43), and the thermal fuse A is provided on the front surface of the substrate 8. Further, terminals 51 to 54 are fixed to the bracket 14 and each connected in series through the resistance elements 41 to 43 (see the solid line 41 and the dotted lines 42 and 43).

The material of the thermal fuse A will be explained in detail with reference to FIG. 2 below.

First, as shown in FIG. 2, the substrate 8 consists of an insulating material, such as a ceramic having a linear expansion coefficient $\alpha=7\times 10^{-6}$ (/°C.). Further, the wire pattern 9 (9') including the resistance elements 41 to 43 is formed on the surface of the substrate 8. The wire pattern 9 (9') consists of a corrosion-resisting electrical conductive material, such as a copper or a silver, and, preferably, its thickness is about 15 to 20 μm. Further, the gap 10 is provided between the wire pattern 9 and 9' in order to cut off an electrical connection therebetween. Preferably, the width of the gap 10 is about 18 to 20 mm.

As shown in FIG. 2, the plate spring 11 is provided across the gap 10, and a U-shaped portion 11b is provided in the vicinity of the center thereof. The plate spring 11 consists of a metal material having a highly elastic characteristic, such as a beryllium copper (the linear expansion coefficient $\alpha=17.8\times 10^{-6}$ (/°C.)) or a phosphor bronze. The original length before it is bent is about 35 mm, the width is about 3 mm and the thickness is about 0.1 to 0.15 mm. After the U-shaped portion was formed, the length of the plate-like spring 11 becomes about 26 mm.

Further, in this embodiment, the plate-like electrically conductive member 12 is fixed to the inner surface of the end portion 11a of the plate spring 11 by using a welding technique. In this case, the electrically conductive member 12 is formed by the metal having a small linear expansion coefficient as well as the substrate 8, such as a molybdenum ($\alpha=5.1\times 10^{-6}$ (/°C.)), an iron-nickel alloy (Fe—42Ni) ($\alpha=4.4\times 10^{-6}$ (/°C.)) or an iron ($\alpha=12\times 10^{-6}$ (/°C.)).

The length of the electrically conductive member 12 is about 8 mm, the width is about 4 mm, and the thickness is about 0.25 mm.

The electrically conductive member 12 is fixed to the plate spring 11 at the position B in the vicinity of the center of the end portion 11a. Further, the electrically conductive member 12 and the other end portion 11c are fixed to the wire patterns 9 and 9' by using the low melting point alloys 13 and 13', respectively.

The low melting point alloy 13 (13') consists of a solder (SL) formed of tin-silver alloys having various compositions, for example;

the first SL is formed by Sn-96.5 and Ag-3.5 ($\alpha=30.2\times 10^{-6}$ (/°C.)), and its melting point is $T_m=221$ (°C.));

the second SL is formed by Sn-63 ($\alpha=25.5\times 10^{-6}$ (/°C.)) and its melting point is $T_m=183$ (°C.)); and the third SL is formed by Sn-100 ($\alpha=26.6\times 10^{-6}$ (/°C.)) and its melting point is $T_m=238$ (°C)).

In this case, the length of the solder is about 3 mm, and the thickness is 0.15 mm. The width of the solder is the same as that of the plate spring 11.

The plate spring 11 is previously bent before the end portions 11a and 11c are fixed to the wire pattern 9 (9') as shown by the chain dotted line 11'. When the end portions 11a and 11c are fixed by using the low melting point alloys 13 and 13', the plate spring 11 is formed approximately straight as shown by the solid line.

Further, in FIG. 5, the end portion 11a of the plate spring 11 is arranged in the vicinity of the position where the temperature becomes the highest on the substrate 8. Concretely, as shown by the number 11a in the drawing, the end portion 11a is arranged in the vicinity of the center 8a of the substrate 8. According to this position, the largest influence of the heat generated by the resistance elements 41 to 43 is applied to the end portion 11a.

The operation of the present invention will be explained in detail with reference to FIGS. 2 to 5.

As mentioned above, the U-shaped portion 11b is previously formed in the vicinity of the center of the plate spring 11. Further, each end portions 11a and 11c of the plate spring 11 is fixed to the end of the wire pattern 9 (9') by welding the low melting point alloy 13 (13'). According to this structure, the thermal expansion of the plate spring 11 can be absorbed by the U-shaped portion 11b between the low melting point alloys 13 and 13'.

When the driver turns on an ignition switch (not shown) and operates an airflow adjusting switch (not shown) so as to obtain the minimum airflow from the fan 3 (see FIG. 3), the movable member 6 is connected to the contact point (4). In this case, since the speed control resistor 1 is arranged down-stream of the fan 3 in the air duct 2 as shown in FIG. 3, the speed control resistor 1 can be always cooled by the wind from the fan 3.

However, when an abnormal state, for example, a state which the blower motor 7 is locked, occurs in the vehicle, an over-current flows through the electric circuit including the speed control resistor 1 so that the resistance elements 41 to 43 are abnormally heated. Accordingly, as explained above, the temperature of the center 8a (see FIG. 5) on the substrate 8 rises to the highest state.

As a result, when the low melting point alloy 13 which is used for fixing the end portion 11a to the wire pattern 9, is heated and its temperature reaches a predetermined melting point $T_m$ (about 200° C.), the low melting point alloy 13 starts to melt. When the low melting point alloy 13 is melted, the end portion 11a of the plate spring 11 is released from the low melting point alloy 13 based on its own elastic force as shown by the chain dotted line in FIG. 2. Accordingly, since the thermal fuse A is disconnected from the resistance elements 41 and 42 in the resistor 1 in FIG. 2, the electric circuit can be completely cut off.

Even if the over-current does not flow through the electric circuit, the resistance elements 41 to 43 become hot in the normally activated state so that the center portion 8a of the substrate 8 is heated. In this case, the low melting point alloy 13 is heated based on the heat from the center portion 8a to about 140° C. Accordingly, the low melting point alloy 13 becomes soft.

However, in this embodiment, as shown in FIG. 2, the electrically conductive member 12 having the linear expansion coefficient which is very close to that of the substrate 8, is fixed to the end portion 11a of the plate spring 11 by welding the electrically conductive member 12 in the vicinity of the center portion B. In this case, since the thermal expansion coefficient of the plate spring 11 is very large, it is considerably expanded in the vicinity of the center portion B. On the other hand, since the linear expansion coefficients of the electrically conductive member 12 and the substrate 8 are small, the electrically conductive member 12 is slightly expanded and the expanded amount is very close to that of the substrate 8.

Accordingly, the upper portion (see (a) in FIG. 2) of the low melting point alloy 13 is deformed in accordance with the thermal expansion of the electrically conductive member 12, i.e., approximately the same amount as the thermal expansion of the substrate 8. Further, since the wire pattern 9 (9') is very thin compared to the substrate 8 and fixed thereto, the thermal expansion of the wire pattern 9 (9') is approximately the same amount as that of the substrate 8. Accordingly, the lower portion (see (b) in FIG. 2) of the low melting point alloy 13 is deformed in accordance with the thermal expansion of the substrate 8. As a result, when the electrically conductive member 12 is provided to the end portion 11a as shown in FIG. 2, the thermal stress, which occurs in the end portion 13a of the low melting point alloy 13, becomes very small so that it is possible to suppress occurrence of cracking in the low melting point alloy 13.

The inventor performed a test, in order to confirm the effect of this invention, as follows.

The first test sample was a conventional type. A conventional speed control resistor having the thermal fuse A formed by the plate spring 11 was assembled in the speed control resistor of FIG. 5. In this case, the thermal fuse A was a straight shape as shown in FIG. 1A (i.e., no U-shaped portion and no electrically conductive member). Further, the gap 10 between the low melting point alloy 13 and 13' was set to 20 mm. The plate spring 11 consists of the beryllium copper, and its length was 26 mm, the width was 2.5 mm, and the thickness was 0.1 mm. The low melting point alloy 13 (13') consists of the solder formed of tin (Sn) 96.5% and the silver (Ag) 3.5%, and its length was 3 mm, the width was 2.5 mm, and thickness was 0.15 mm.

The second test sample incorporated the present invention. The speed control resistor 1, according to the present invention, having the thermal fuse A formed by the U-shaped portion 11b in the vicinity of the center of the plate spring 11, and the electrically conductive member 12 at the end portion 11a was assembled as shown in FIG. 2. In this case, the gap 10 between the low melting point alloy 13 and 13' was set to 20 mm. The plate spring 11 consisted of beryllium copper, and the length was 35 mm, the width was 2.5 mm, and the thickness was 0.1 mm. The actual length of the plate spring 11 was about 26 mm after the U-shaped portion 11b was formed. Further, the electrically conductive member 12 consists of an iron-nickel alloy (Fe—42Ni), and the length was 8 mm, the width was 4 mm, and the thickness was 0.25 mm. Still further, the low melting point alloy 13 (13') consisted of the solder formed by tin (Sn) 96.5% and the silver (Ag) 3.5%, and the length was 3 mm, the width was 4.0 mm, and the thickness was 0.15 mm.

In an actual test, the first and second samples were alternately dipped during five minutes into two kinds of silicon oil having the temperature of minus (−) 40 (°C.) and plus (+) 150 (°C.). After these steps were repeated 1,200 times, the configuration (state) of the low melting point alloy 13 was compared between the first and second samples.

As a result of comparison, in the first sample (i.e., conventional type), a large crack occurred in the low melting point alloy 13 in longitudinal direction of the plate spring 11 so that the low melting point alloy 13 was cut off. On the other hand, in the second sample (i.e., the present invention), no cracking occurred in the low melting point alloy 13. Accordingly, it was obvious that the present invention, having the electrically conductive member 12 and the U-shaped portion 11b, was very effective for prevention of cracking.

Figure 6A:
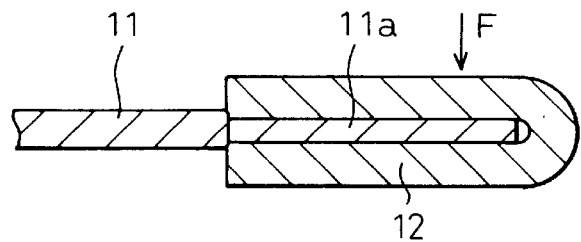
FIGS. 6A to 6C show electrically conductive members according to other examples of the present invention.
Figure 6B:
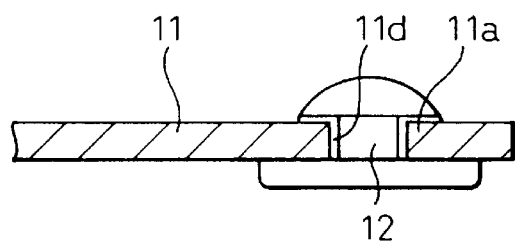
Figure 6C:
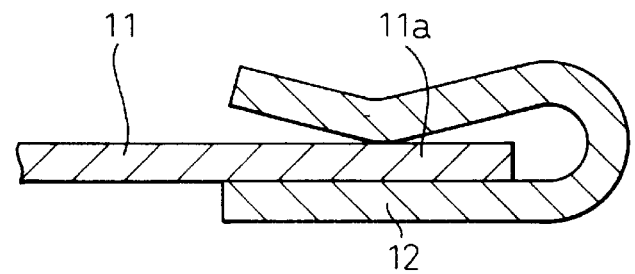
Figure 7:
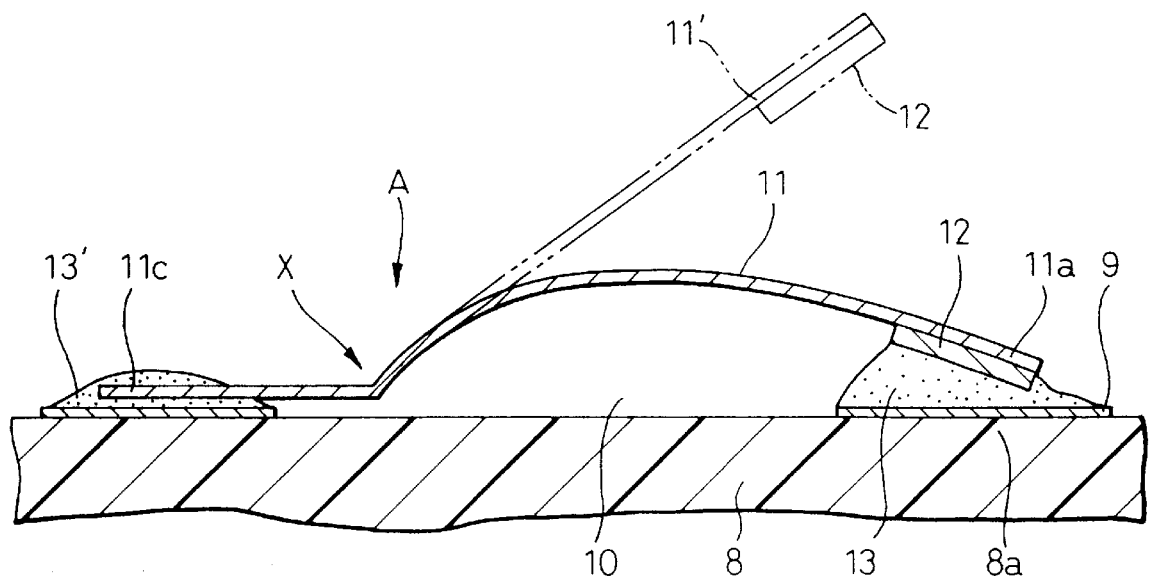
FIG. 7 shows the thermal fuse according to a second embodiment of the present invention.

FIGS. 6A to 6C show electrically conductive members according to another examples of the present invention, and FIG. 7 shows a thermal fuse according to a second embodiment of the present invention.

The second embodiment will be explained in detail with reference to FIGS. 6A to 6C and 7. In the first embodiment mentioned above, the electrically conductive member 12 is fixed to the end portion 11a by welding it to the end portion 11a. In this second embodiment, three examples of fixing the plate spring 11 and the electrically conductive member 12 are shown in FIGS. 6A to 6C.

In FIG. 6A, the electrically conductive member 12 has a hairpin-like shape. This hairpin-like conductive member 12 is inserted to the end portion 11a of the plate spring 11, and these parts 11 and 12 are pressed (caulked) from the perpendicular direction (see arrow line F) so that the electrically conductive member 12 can be fixed to the end portion 11a.

In FIG. 6B, the electrically conductive member 12 has a rivet-like shape. A hole is provided for the end portion 11a of the plate spring 11. The rivet is inserted into the hole and pressed from the perpendicular direction so that it is possible to obtain a flat portion of the electrically conductive member 12.

In FIG. 6C, the conductive member 12 has a C-shaped shape so as to have an elastic force. The C-shaped conductive member 12 is inserted to the end portion 11a of the plate spring 11 so that the electrically conductive member 12 can be fixed to the end portion 11a of the plate spring 11 based on its own elastic force.

According to the above second embodiment, since no welding portion is provided between the electrically conductive member 12 and the end portion 11a of the spring 11, it is easy to reduce the manufacturing cost of the speed control resistor and to assemble these parts 11 and 12.

Still further, in the examples shown in FIGS. 6A to 6C, since the electrically conductive member 12 is not welded to the end portion 11a and only strongly held by the end portion 11a, the plate spring 11 and the electrically conductive member 12 can thermally expand independently each other by overcoming a friction force which occurs between them.

In the above embodiments, although the U-shaped portion is provided in the vicinity of the center of the plate spring 11, the present invention is not limited to this U-shape. That is, a M-shaped portion can be used instead of the U-shaped portion since the M-shaped portion also can absorb the thermal expansion of the plate spring 11.

Still further, in the above embodiments, the U-shaped portion 11b and the electrically conductive member 12 are provided in order to prevent cracking in the low melting point alloy 13. However, only the electrically conductive member 12 is provided to the end portion 11a of the plate spring 11, it is possible to considerably suppress occurrence of cracking in the low melting point alloy 13 compared to the conventional art shown in FIGS. 1A and 1B.

FIG. 7 is another example of the thermal fuse according to the present invention. In this example, the plate spring 11 is previously bent as shown by the chain dotted line 11' at a point X, and the U-shaped portion is not provided in this example. The end portion 11a having the electrically conductive member 12 is forcedly fixed to the wire pattern 9 by welding the low melting point alloy 13 as shown by the solid line. As explained above, when the low melting point alloy 13 is melted, the end portion 11a of the plate spring 11 is released from the low melting point alloy 13 and returned to the original position shown by the dotted line.

Still further, the plate spring 11 is not limited to this shape. That is, another shape can be used instead of the plate spring 11 if the function explained in the first and second embodiments can be obtained.

We claim:

1. A thermal fuse comprising:

a substrate consisting of an insulating material;

a wire pattern formed on a surface of the substrate;

a gap for electrically cutting off the wire pattern;

a plate spring consisting of an electrically conductive material arranged across the gap;

an electrically conductive member fixed to one end of the plate spring on a side of the wire pattern and having approximately the same linear expansion coefficient as that of the substrate;

a first low melting point alloy for welding the electrically conductive material and the wire pattern provided on one side of the gap;

a second low melting point alloy for welding the other end of the plate spring and the wire pattern provided on the other side of the gap;

wherein, when the first low melting point alloy is melted, the electrically conductive member is released from the first low melting point alloy so that the plate spring is also released from the wire pattern.

2. A thermal fuse as claimed in claim 1, wherein the plate spring has a U-shaped portion for absorbing a thermal expansion thereof at a position between the first and second low melting point alloys.

3. A thermal fuse as claimed in claim 1, wherein the electrically conductive member has a hairpin-like shape and is caulked to said one end of the plate spring.

4. A thermal fuse as claimed in claim 1, wherein the electrically conductive member has a hairpin-like shape so as to have an elastic force and is fixed to said one end of the plate spring elastic force.

5. A thermal fuse as claimed in claim 1, wherein the electrically conductive member has a rivet-like shape, is inserted into a hole provided on said one end of the plate spring, and is pressed and fixed to said one end of the plate spring so as to form a flat portion on a side thereof facing the wire pattern.

6. A thermal fuse as claimed in claim 1, wherein the electrically conductive member is fixed to the plate spring so as to be able to thermally expand independently of the plate spring.

* * * * *